United States Patent [19]

Matsuzawa

[11] Patent Number: 5,608,389
[45] Date of Patent: Mar. 4, 1997

[54] REMOTE CONTROL DEVICES FOR ELECTRONIC APPLIANCES

[75] Inventor: Kouichi Matsuzawa, Fussa, Japan

[73] Assignee: Casio Computer Co., Ltd., Tokyo, Japan

[21] Appl. No.: 350,539

[22] Filed: Dec. 7, 1994

[30] Foreign Application Priority Data

Dec. 20, 1993 [JP] Japan ................................ 5-344998
Jun. 29, 1994 [JP] Japan ................................ 6-171884

[51] Int. Cl.$^6$ .................................................. H04Q 1/00
[52] U.S. Cl. ................ 340/825.57; 341/176; 348/734; 340/825.72; 340/825.56
[58] Field of Search ................ 340/825.56, 825.22, 340/825.57, 825.69, 825.72; 348/734, 729; 455/139; 341/176; 359/142; 364/200

[56] References Cited

U.S. PATENT DOCUMENTS

| | | | |
|---|---|---|---|
| 4,080,659 | 3/1978 | Francini | 364/200 |
| 4,317,227 | 2/1982 | Skerlos | 455/180 |
| 4,456,925 | 6/1984 | Skelos | 348/734 |
| 4,525,866 | 6/1985 | Templin | 455/180 |
| 4,862,268 | 8/1989 | Campbell | 348/734 |
| 5,020,139 | 5/1991 | Keenan . | |
| 5,020,140 | 5/1991 | Teskey | 455/180 |
| 5,440,351 | 8/1995 | Ichino | 348/729 |
| 5,475,382 | 12/1995 | Yuen | 340/825.72 |

FOREIGN PATENT DOCUMENTS

| | | | |
|---|---|---|---|
| 3404976A1 | 8/1985 | Germany . | |
| 2238146 | 5/1991 | United Kingdom | 341/176 |

Primary Examiner—Brian Zimmerman
Attorney, Agent, or Firm—Frishauf, Holtz, Goodman, Langer & Chick

[57] ABSTRACT

A remote control device for an electronic appliance includes a plurality of channel number inputting keys for inputting a channel number and a further key different from the plurality of channel number inputting keys. When the further key was operated, a CPU determines whether any one of the plurality of channel number inputting keys was operated directly before the further key was operated. If so, the CPU sends the electronic appliance a first remote control code related to channel selection. If not, the CPU sends the electronic appliance a second remote control code which controls a function different from the channel selection. In this case, the sole key fulfills the two functions to reduce the number of keys.

7 Claims, 9 Drawing Sheets

REMOTE CONTROL DEVICES FOR ELECTRONIC APPLIANCES

BACKGROUND OF THE INVENTION

The present invention relates to remote control devices for controlling domestic electronic appliances remotely.

Recently, a remote control device is annexed to an electronic appliance such as a television set or a video tape recorder. The user is capable of using such remote control device for controlling the functions of the electronic appliance from far away.

A cable television set used in the Northern American district has many channels, for example, scores of channels. Thus, a remote control device used to control such television set has a key-in unit which includes keys numbered "0"–"9" to key in numeral data "0"–"9" to designate a channel and an enter key which is used to designate the end of keying-in a channel number after the channel number is keyed in one figure by one figure.

For example, in order to designate a channel "2" which is a number of one figure, a key numbered "2" and the enter key are required to be operated in this order. In order to designate a channel numbered "25", the keys numbered "2" and "5" and the enter key are required to be operated in this order. However, the respective keys for designating those channels perform only a sole control function. Thus, the number of keys is large and the whole device is large-scaled, disadvantageously.

Another remote control device has a key "10+" to key in data on a numeral at the place of "10" in addition to the keys numbered "0"–"9" to key in a channel number of two figures. For example, when a channel "12" is desired to be selected, the keys "10+" and the key "2" are required to be operated in this order to thereby convert "10+" and "2" to corresponding remote control codes, which are then sent sequentially. Those sent remote control codes are received by a television set at a receiving end to thereby select the channel "12". In this remote control device, the key "10+" is required to be provided to thereby increase the number of keys and hence render the whole remote control device large-scaled.

In order that data on any one of 20–29, 30–39 and 40–49 channels may be keyed in, further keys "20+", "30+" and "40+" are required to be provided and hence the whole remote control device would be large-scaled.

SUMMARY OF THE INVENTION

It is an object of the present invention to provide a small-sized remote control device which reduces the number of keys which key in numerical data.

It is another object of the present invention to provide a remote control device easy to key in data.

In order to achieve the above objects, the present invention provides a remote control device for an electronic appliance, comprising:

a plurality of channel number inputting keys for inputting a channel number to the remote control device;

a further key different from the plurality of channel number inputting keys;

when the further key was operated, determining means for determining whether any one of the plurality of channel number inputting keys was operated directly before the further key was operated; and remote control code sending control means for sending the electronic appliance a first remote control code related to channel selection when the further key was operated and the determining means determines that any one of the plurality of channel number inputting keys was operated directly before the further key was operated, and for sending the electronic appliance a second remote control code which controls a function different from the channel selection when the further key was operated and the determining means determines that none of the plurality of channel number inputting keys was operated directly before the further key was operated.

According to the present invention, the further key which is operated after a channel number inputting key was operated to send the electronic appliance a remote control code to select a channel can be used to send the electronic appliance a remote control code to control the function different from the selection of the channel when no original function of the further key is required, so that the number of keys of the remote control device is reduced to thereby achieve reduction of the size of the remote control device.

In order to achieve the above objects, the present invention also provides a remote control device for an electronic appliance, comprising:

a plurality of channel number inputting keys for inputting a channel number to the remote control device;

when any one of the plurality of channel number inputting keys was operated, time measuring means for measuring the time elapsed since that channel number inputting key was operated;

determining means for determining the elapsed time measured by the time measuring means has not arrived at a given time; and remote control code sending control means for sending the electronic appliance a remote control code to select a predetermined channel when the determining means determines that the elapsed time has not arrived at the given time and for sending the electronic appliance a remote control code to select a channel different from the predetermined channel when the determining means determines that the elapsed time has exceeded at the given time.

According to the present invention, when a channel number key is operated, a remote control code which selects a different channel is sent in dependence on whether the given time has elapsed since the operation of the channel number key, so that the number of keys of the remote control device is reduced to thereby achieve reduction of the size of the remote control device.

DESCRIPTION OF THE PREFERRED EMBODIMENTS

Figure 1:
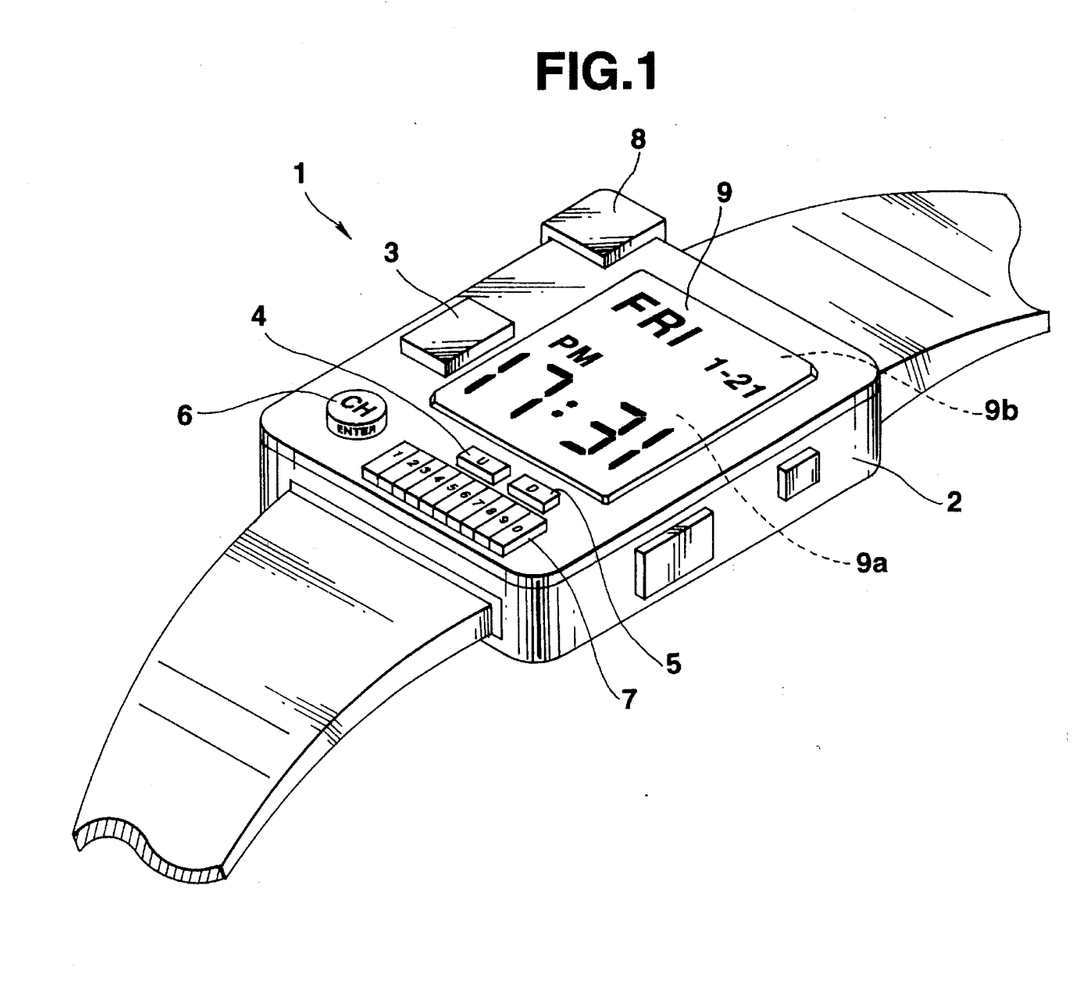
FIG. 1 is a perspective view of a wrist watch to which a remote control device of a first embodiment of the present invention is applied.
Figure 2:
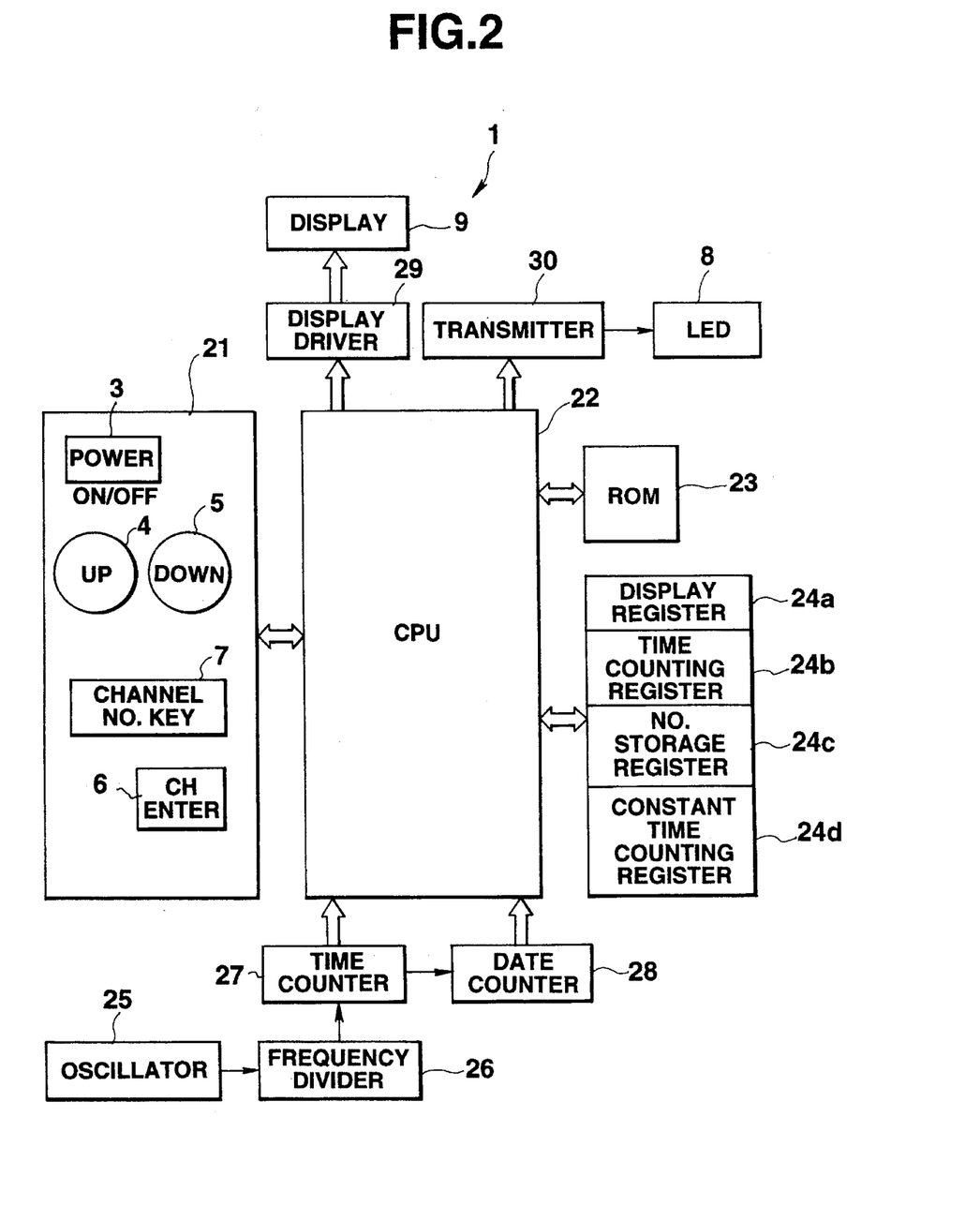
FIG. 2 is a block diagram indicative of the circuit structure of the wrist watch of FIG. 1.
Figure 3:
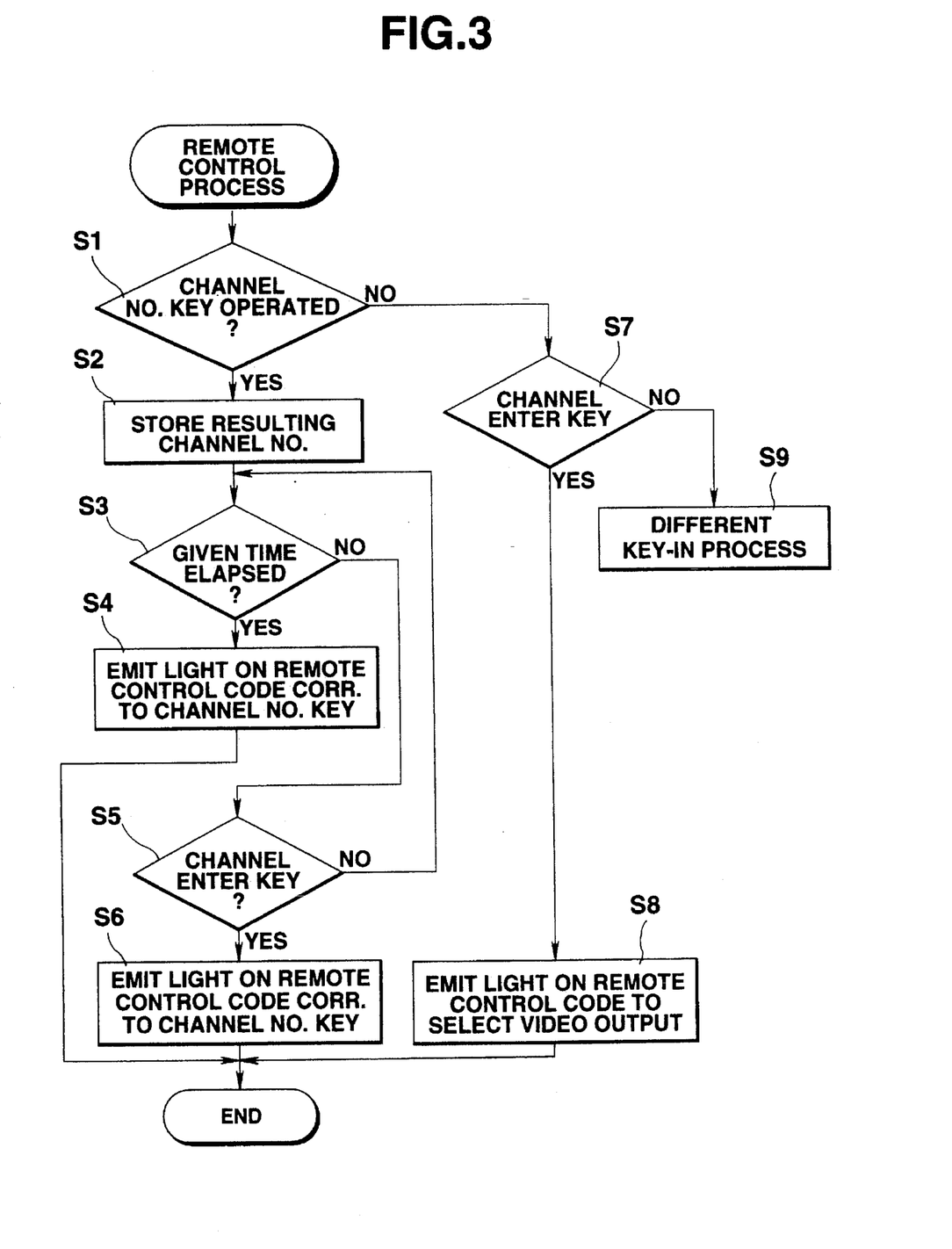
FIG. 3 is a flowchart indicative of a remote control process performed by a CPU of FIG. 2.

[First Embodiment](FIGS. 1–3)

Structure

FIG. 1 shows a wrist watch 1 to which a remote control device of a first embodiment of the present invention is applied. In FIG. 1, the wrist watch 1 has in an upper surface of a case 2 a power key 3 which turns on/off a power supply for an electronic appliance at a receiving end, a volume up key 4 and a volume down key 5 for volume adjustment, a channel enter key 6 which selects a television channel, a channel number key subunit 7 which includes ten channel number keys numbered "1", "2", "3", . . . "9", "0" for designation of a television channel No., an LED (Light Emitting Device) 8 which emits light on various remote control signals and a display 9 composed of a liquid crystal display panel for display of the time 9a and the contents of a remote control operation 9b.

The remote control operation key group of this embodiment uses the specifications of a remote control device for a cable television set used in the Northern American district.

FIG. 2 is a block diagram of the system of the wrist watch 1 of FIG. 1. The same element is identified by the same reference numeral in FIGS. 1 and 2. In FIG. 2, the wrist watch 1 includes an input unit 21, a CPU (Central Processing Unit) 22, a ROM (Read Only Memory) 23, a RAM (Random Access Memory) 24, an oscillator 25, a frequency divider 26, a time counter 27, a date counter 28, a display driver 29, the display 9, a transmitter 30 and the LED 8.

The input unit 21 is comprised of the power key 3, volume up key 4, volume down key 5, channel enter key 6, channel number key subunit 7 of FIG. 1. Various remote control command signals produced by the respective keys are output to the CPU 22.

The CPU 22 controls the respective elements of the wrist watch 1 in accordance with various control programs stored in the ROM 23. More specifically, the CPU performs the timekeeping and displaying processes, outputs time and date data from the time counter 27 and date counter 28 through the display driver 29 to the display 11 for displaying purposes. The CPU also performs remote control processes in accordance with various remote control command signals from the input unit 21, outputs various remote control data to the transmitter 30 to cause the LED 8 to emit light on remote control signals.

In the remote control process to be described later in more detail, the CPU 22 waits for a lapse of a given time after a key of the channel number key subunit 7 was operated and then selects direct transmission of the keyed-in channel number or transmission of a channel number determined by the channel enter key.

The ROM 23 stores a timekeeping process program, a displaying process program and a remote control process program executed by the CPU 22 and remote control code data corresponding to the contents of the various operations to control electronic appliances such as a television set and a video tape recorder remotely.

As shown in FIG. 2, the RAM 24 includes a display register 24a which stores displayed data, a time counting register 24b which stores time data, a number storage register 24c which stores channel number data based on the operation of a channel number key, and a constant time counting register 24d which stores data on a given period of time to be measured in the remote control process.

Time counter 27 counts time data on an hour, minute and second of the current time on the basis of a pulse signal of a constant cycle fed through the frequency divider 26 from the oscillator 25, and outputs the time data to the CPU 22 and to the date counter 28.

The date counter 28 counts date data on a month, date and day of the week on the basis of the time data fed from the time counter 27, and outputs the date data to the CPU 22.

The display driver 29 drives the display 9 on the basis of displayed data processed and fed by the CPU 22 in accordance with the keying-in operation of the input unit 21 to display the time 9a and the contents of the remote control operation 9b, as shown in FIG. 1.

The transmitter 30 modulates and amplifies in an infrared wavelength remote control data read and supplied by the CPU 22 from the ROM 23 in accordance with a keyed-in signal from the input unit 21 and emits infrared rays on the resulting data from the LED 8.

Operation

In the regular main process performed by the CPU 22 in the wrist watch 1 of this embodiment, the timekeeping operations of the time counter 27 and date counter 28 are performed and the time and date data produced sequentially from the time and date counters 27 and 28 are stored in the time counting register 24b of the RAM 24, and output through the display driver 29 to the display 9 to thereby display the time.

When the user operates a key of the key-in unit 21 in the main process, the CPU 22 starts the remote control process as an interrupt to the main process in accordance with a flowchart of FIG. 3.

In FIG. 3, the CPU 22 first determines whether a channel number key has been operated (step S1). If so, the CPU stores the resulting channel number data in the number storage register 24c of the RAM 24 (step S2). If not, the CPU performs processes at steps S7 and S8 steps.

The CPU 22 determines whether a given time has elapsed on the basis of time data preset in the constant time counting register 24d of the ROM 24 (step S3). If so, the CPU outputs to the transmitter 30 remote control data corresponding to the channel number stored in the number storage register 24c at step S2 to thereby cause the LED 8 to emit light on the remote control code data (step S4) and ends this process.

If not at step S3, the CPU 22 determines whether the channel enter key 6 has been operated (step S5). If not so, control returns to step S3. If the channel enter key 6 has been operated, the CPU outputs to the transmitter 30 remote control data corresponding to the channel number data stored in the number storage register 24c at step S2 to cause the LED 8 to emit light on the remote control data (step S6) and ends this process.

If no channel number key is operated at step S1, the CPU 22 determines whether the channel enter key 6 has been operated (step S7). If not, the CPU performs a different process (step S9). If the channel enter key 6 has been operated, the CPU outputs to the transmitter 30 remote control data for selecting and displaying the output of a video tape recorder connected to the television set at the receiving end to thereby cause the LED 8 to emit light on the remote control data (step S8) and ends this process.

As described above, in the remote control process of this embodiment, if the channel enter key 6 is operated after a channel number key was operated or if no keyed-in data is produced several seconds after a channel number key was operated, the channel number code is delivered to the television set or video tape recorder to change the channel.

In the present embodiment, if the channel enter key 6 is operated after a channel number key was operated, the channel switching code is sent to the television set. If the channel enter key 6 is operated without any other keys being operated beforehand, a code which selects and displays the output of the video tape recorder connected to the television set at the receiving end is sent to the video tape recorder.

That is, the contents of the remote control for one key are selected automatically in dependence on whether particular keyed-in data is generated beforehand.

Therefore, there is no need for taking the trouble to provide a key to switch between the television set and the video tape recorder to thereby reduce the number of keys of the remote control device and hence its cost.

While in the present embodiment the application of the inventive remote control device to the wrist watch has been described and illustrated, the present invention is not limited to this particular case. The inventive remote control device is applicable to conventional learning remote control devices to reduce the number of keys used in the learning control devices.

[Modification]

A modification of the first embodiment has an appearance and a circuit structure similar to those of FIGS. 1 and 2 and further description and illustrations thereof will be omitted.
Operation In FIG. 4, first, in order to input a channel number, the CPU determines whether the corresponding channel number key has been operated (step A1). If so, the CPU sends the electronic appliance a remote control code indicative of the operated channel number key (step A2). The CPU then sets "1" in a flag register F which stores the sent remote control code (step A3). Control then returns to step A1.

Figure 4:
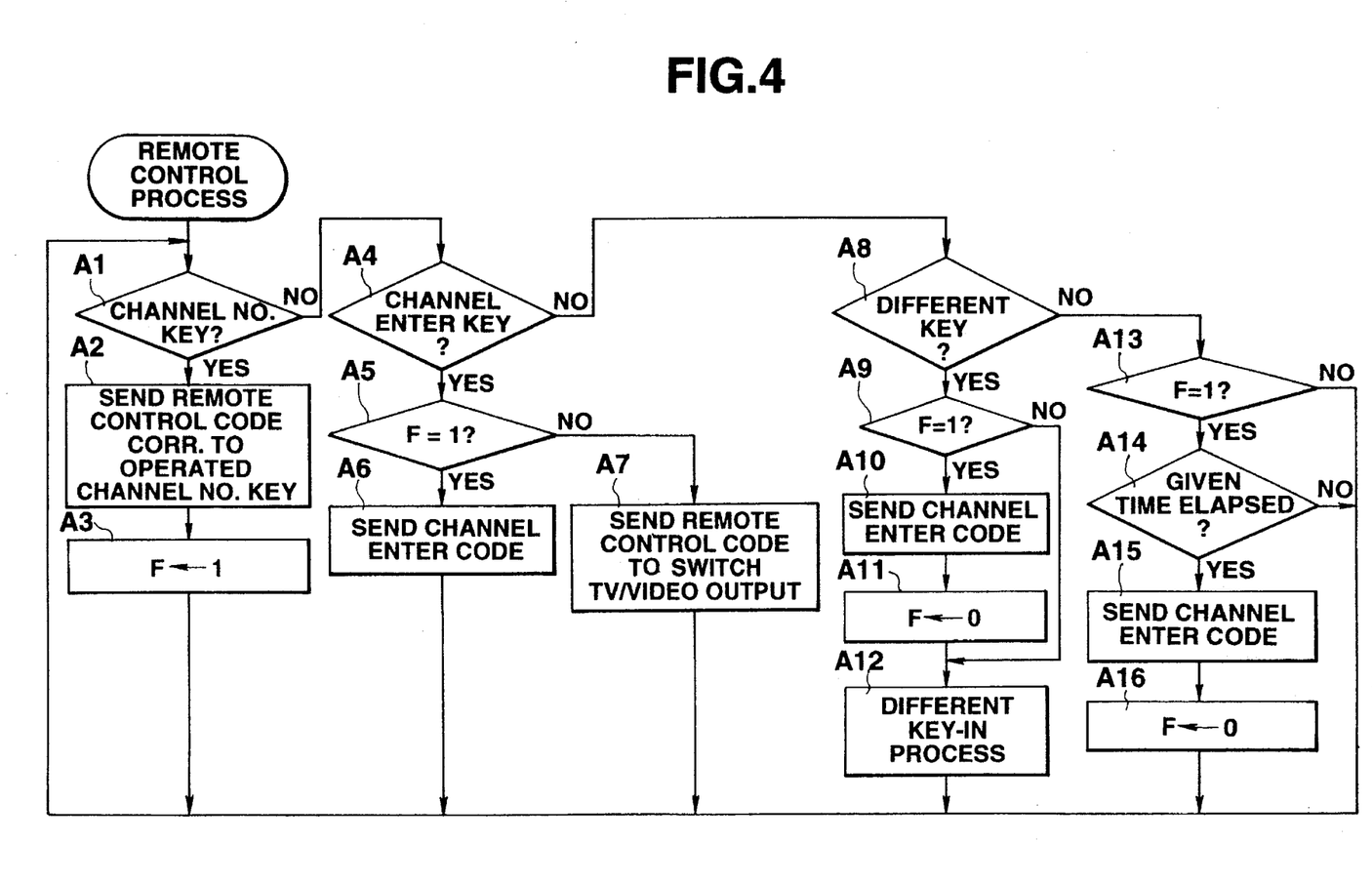
FIG. 4 a flowchart indicative of the operation of a remote control device as a modification of the first embodiment.

If not at step A1, control passes to step A4, where the CPU determines whether the channel enter key 6 has been operated. If so, the CPU determines whether "1" has been stored in the flag register F or whether the channel number key is the last operated one and a given time has elapsed since the last operation of the channel number key (step A5).

If the CPU determines that (1) "1" is stored in the flag register F, (2) the last operated key is the channel number key and (3) the given time has not elapsed since the last operation of the channel number key, the CPU sends the television set at the receiving end a channel enter code indicative of the end of the sending of the channel number through the transmitter (step A6).

When the television set receives the channel enter code, it selects a channel indicated by the channel number code received so far. In more detail, after the television set receives a code "2" and then the channel enter code, it switches the channel to a channel "2". If the television set receives "2", "5" and then the channel enter code, it switches the channel to a channel "25".

When at step A4 the flag register F is not "1", or the last operated key is not a channel number key or when the last operated key is a channel number key and the given time has elapsed since the last operation of the channel number key, the CPU sends a remote control code to switch between the television output and the video tape recorder output and displays the selected one (step A7). Control then returns to step A1.

When the CPU determines at step A4 that the channel enter key 6 has not been operated, control passes to step A8 where the CPU determines whether a different key has been operated. If so, control passes to step A9, where the CPU determines whether "1" is set in the flag register F. If so, control passes to step A10, where the CPU sends a channel enter code, sets the flag register F at "0" (step A11) and then performs a different key-in process (step A12).

When the CPU determines at step A8 that no different key has been operated, control passes to step A13, where the CPU determines whether "1" is set in the flag register F. If so, control passes to step A14, where the CPU determines whether the given time has elapsed since the last operation of the channel number key. If so, the CPU sends the electronic appliance a channel enter code (step A15), and sets "0" in the flag register F (step A16). Control then returns to step S11.

As described above, in the remote control process of this modification, if the channel enter key 6 is operated after a channel number key was operated to input a channel number, or if there is no keyed-in data after the operation of the channel number key, the CPU sends the electronic appliance the channel enter code. When the television set receives the channel enter code, it selects a channel in accordance with a numerical code indicative of the received channel number before the reception of the channel enter code.

[Second Embodiment](FIGS. 5–10)

The second embodiment is a remote control device for a television set.
Structure (a) Circuit Structure Referring to FIG. 5, an oscillator 51 outputs a basic clock signal. A frequency divider 52 divides the basic clock signal from the oscillator 51 to output a clock signal required for the remote control device to the CPU 53 to be described later in more detail.

Figure 5:
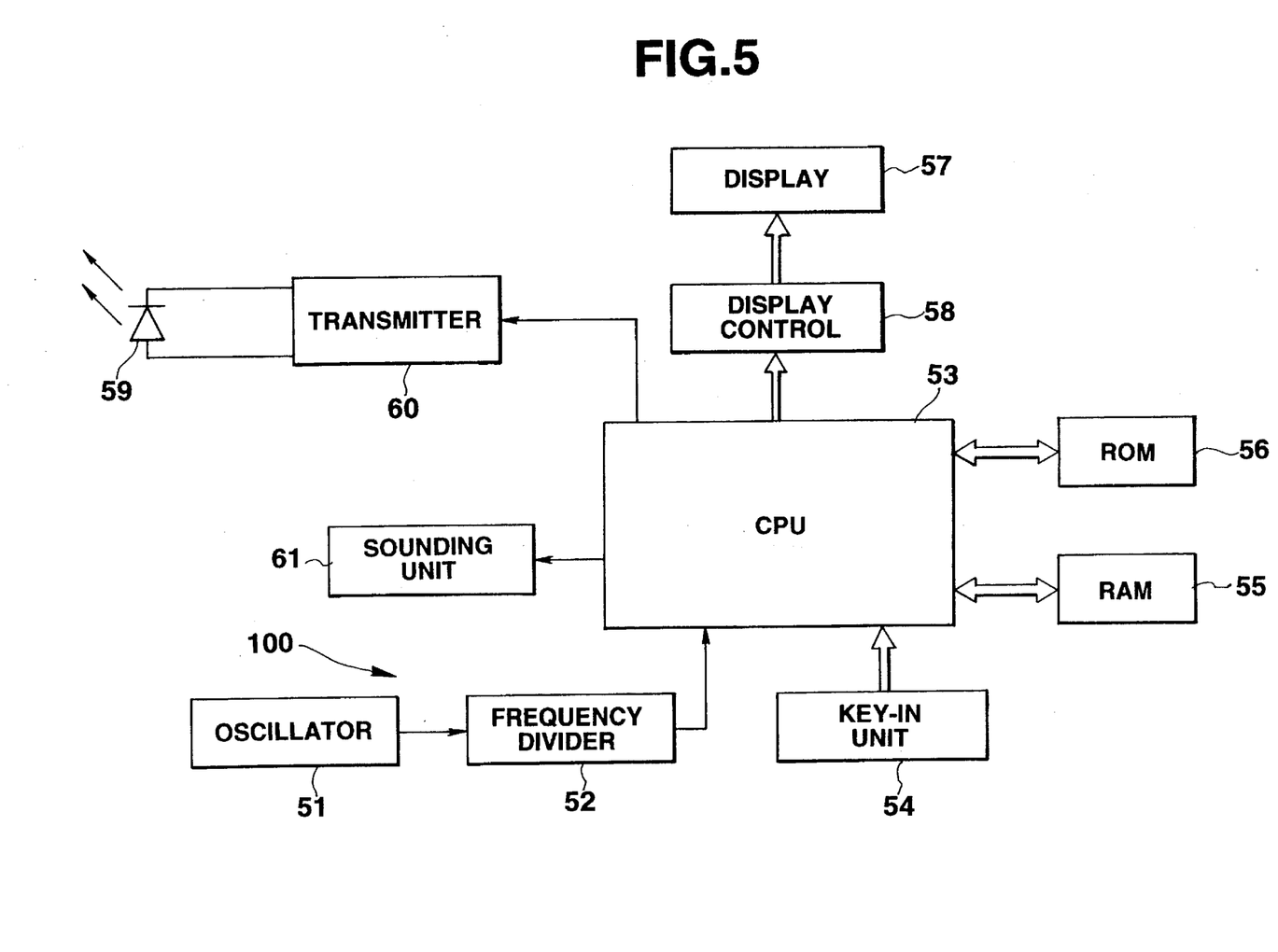
FIG. 5 is a block diagram indicative of the circuit structure of a remote control device of a second embodiment of the present invention.
Figure 6:
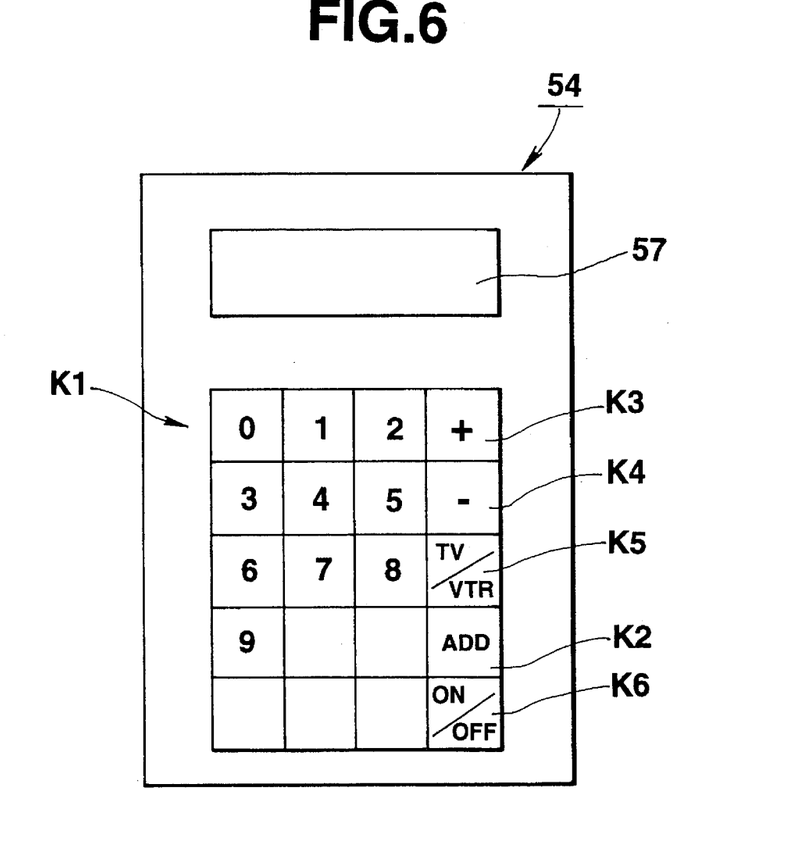
FIG. 6 is a front view of the remote control device of FIG. 5.

As shown in FIG. 6, a key-in unit 54 includes a channel number key subunit K1 including channel number keys "0"–"9" for channel selection, an addition data setting key K2, volume keys K3 and K4, a video/television switching key K5 and a power supply on/off key K6. The key-in unit 54 delivers data on a numerical value and a command. The addition data setting key K2 keys in data on a numeral of two figures (addition data) in the channel selection. Each time the key K2 is operated, a respective one of "10+", "20+", "30+", "10+", "20+", ... is set sequentially in this order and repeatedly.

For example, if the key "3" of the channel number key subunit K1 continues to be operated for two seconds in a state where "10+" as the initial addition data is set, numerical data "3" and addition data "10+" are sent to a television set at the receiving end.

The television set at the receiving end selects a channel "13". The addition data setting key K2 will also be described later. Referring back to FIG. 5, a RAM 55 is used as a working memory of the CPU 53.

Figure 7:
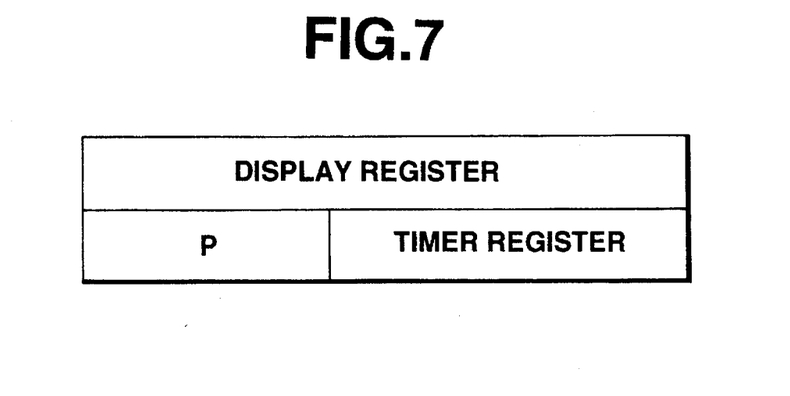
FIG. 7 shows the storage area of a RAM 55 of FIG. 5.

(b) An area map in the RAM 55

FIG. 7 shows an area map in the RAM 55 in which the following registers are set:

A display register which is used to store data to perform various displays;

A timer register which is used to measure the period of time for which any key of the channel number key subunit K1 is operated; and A P register which is used to set addition data with the addition data setting key K2;

P =0: "10+" is set;

P =1: "20+" is set; and

P =2: "30+" is set.

Referring back to FIG. 5, a ROM 56 stores programs to control the CPU 53 and programs to produce a remote control code to be sent from the remote control device.

The ROM 56 stores the addition data or "10+", "20+", "30+", which are selected by the CPU 53 when the addition data setting key K2 is set.

(c) One Example of a Remote Control Code

Figure 8A:
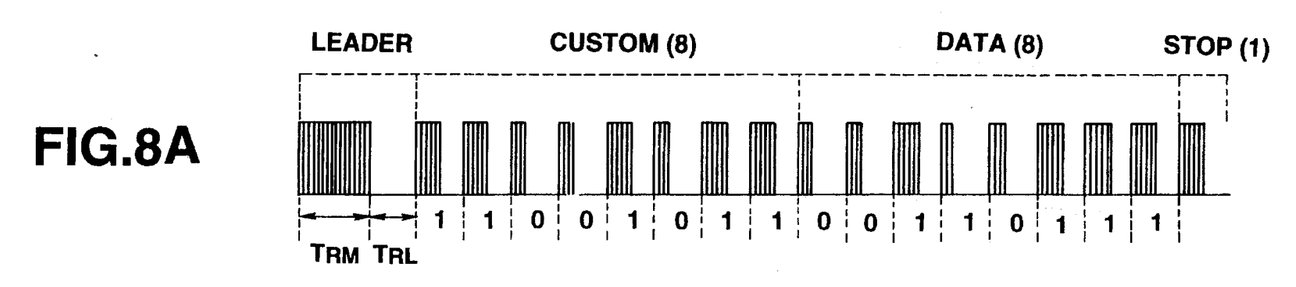
FIGS. 8A–8D each show an illustrative waveform of a remote control code created by the remote control device of FIG. 5.

FIG. 8A is a waveform diagram of one example of a remote control code, which is composed of a leader code, a custom code, a data code and a stop code. The custom code consists of 8 bits and indicates a television set in this embodiment. The data code consists of 8 bits and indicates various functions.

Figure 8B:
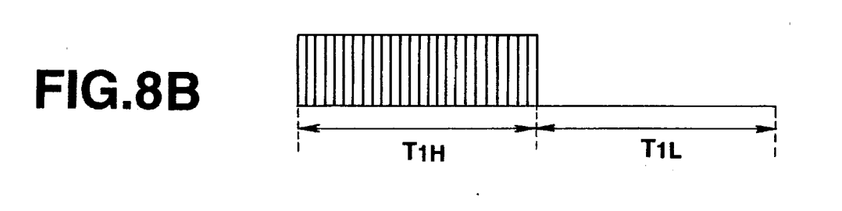
Figure 8C:
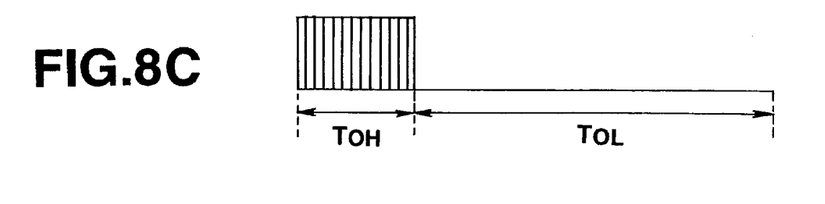
Figure 8D:
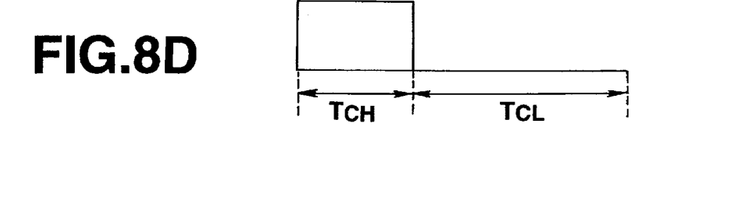

The respective codes are comprised of a carrier frequency shown in FIG. 8D. As shown in FIG. 8A, for example, the leader code has a period of $T_{RM}$ which is a carrier frequency output period. A period $T_{RL}$ other than the carrier frequency output period $T_{1M}$ is a carrier frequency quiescence period. The custom and data codes are composed of data "1" and "0" identified by carrier frequency quiescence periods different in length. As shown in FIG. 8B, the carrier frequency output period $T_{1H}$ is the same as the carrier frequency quiescence output period $T_{1L}$ in data "1". As shown in FIG. 8C, the carrier frequency output period $T_{OH}$ is ⅓ of the carrier frequency quiescence output period $T_{OL}$ in data "0".

Referring back to FIG. 5, a display 57 is used to display a channel number, a volume level and the selected one of the television and video outputs. The display 57 used is an LED, an EL (Electroluminescence), a liquid crystal or plasma display. A display control unit 58 displays data on the display 7 in accordance with control signals from the CPU 53.

Reference numeral 59 denotes an LED for emission of infrared rays. A transmitter 60 drives the LED 59 in accordance with a remote control code fed from the CPU 53. A sounding unit 61 generates a buzzer sound in accordance with a buzzer on signal from the CPU 53 and stops the buzzer sound in accordance with a buzzer off signal.

(d) The Contents of Control By The CPU 53

The CPU 53 controls the respective elements of the remote control device as follows:

(1) The CPU generates a remote control code on the basis of a numerical value or command from the key-in unit 54 and delivers it to the transmitter 60.

(2) The CPU measures the time for which a key of the channel number key subunit K1 of the key-in unit 54 is operated on the basis of the clock signal from the frequency divider 52.

(3) If the time for which a channel number key is operated is less than two seconds, the CPU directly sends the transmitter 60 the numeral value from the channel number key. If the time is more than two seconds, the CPU sends the transmitter data on a numerical value from a channel number key and addition data (for example, "10+") set by the addition data setting key K2. The CPU delivers the keyed-in numerical value and the addition data to the transmitter 60.

(4) The CPU delivers an intermittent buzzer on signal to the sounding unit 61 for a short time when the time for which a channel number key of the key-unit 54 is operated has arrived at two seconds.

(5) The CPU converts the numerical value, a symbol (for example, "+") and a command from the key-in unit 54 to display data, which is then delivered along with a control signal to the display control unit 58.

Figure 9:
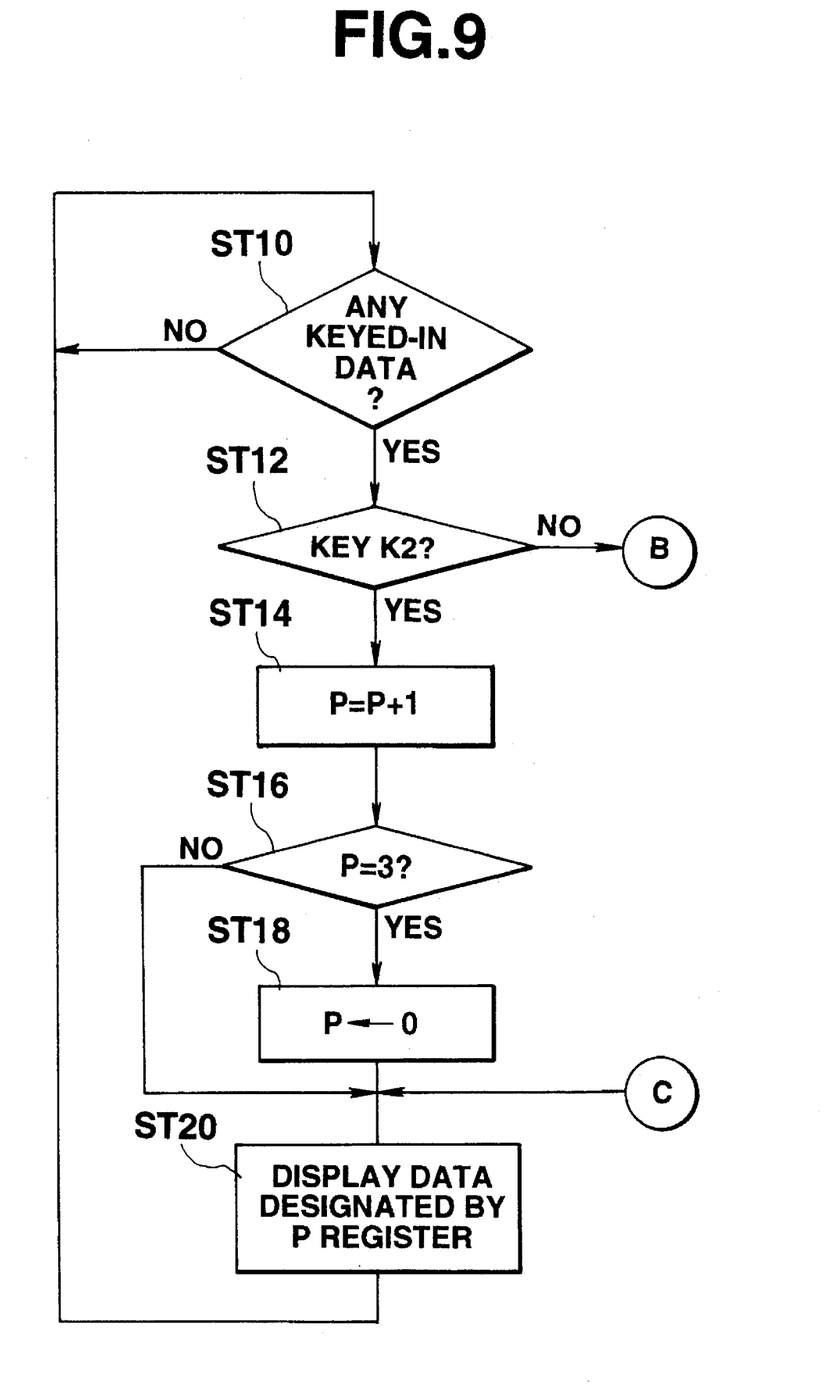
FIG. 9 is a flowchart indicative of the operation of the remote control device of FIG. 5.
Figure 10:
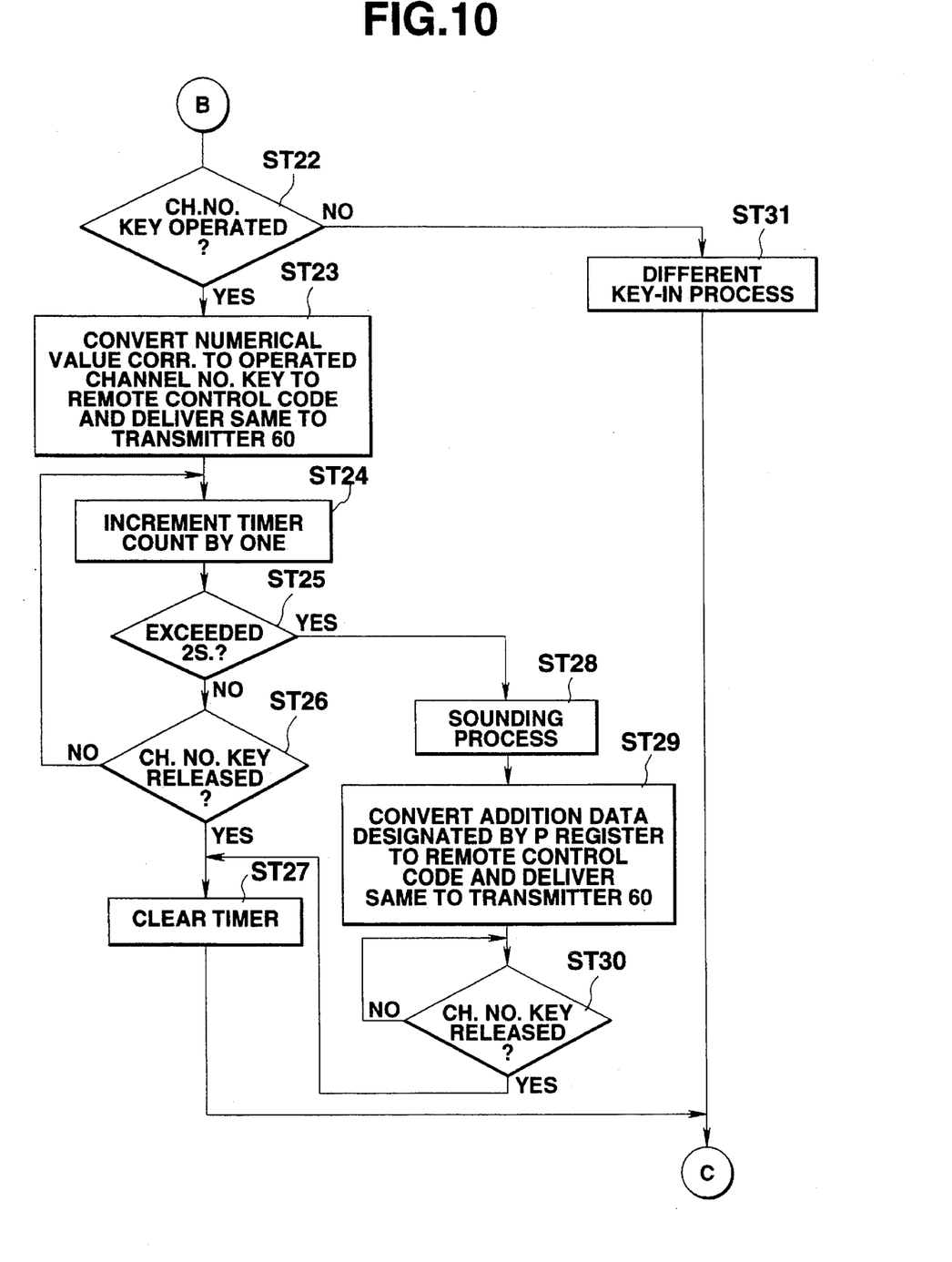
FIG. 10 is a flowchart to be continued from that of FIG. 9.

Operation (FIGS. 9 and 10)

(a) Addition Data Setting Process (steps ST10–ST20 of FIG. 9)

At step ST10 the CPU determines whether there is any keyed-in data. If not, the CPU repeats step ST10. When the CPU determines that there is keyed-in data, control passes to step ST12, where the CPU determines whether there is any keyed-in data from the addition data setting key K2. If so, control passes to step ST14, where the CPU increments the value of the P register by one.

Control then passes to step ST16, where the CPU determines whether the value of the P register is "3". If so, control passes to step ST18, where the CPU sets "0" in the P register or initializes the same.

Control then passes to step ST20, where the CPU displays data designated by the value of the P register and in this case, as "10+". If the value of the P register is not "3", control passes to step ST20, where the CPU displays data designated by the value of the P register.

In this case, if the value of the P register is "0" before the operation of the addition data setting key K2, the value of the P register becomes "1" by the operation of the addition data setting key K2, and the data designated by the value of the P register becomes "20+" to thereby displays "20+". If the value of the P register is "1" before the operation of the addition data setting key K2, the value of the P register becomes "2" by the operation of the addition data setting key K2. Thus, the data designated by the value of the P register becomes "30+", which is then displayed.

(b) A Remote Control Code Sending Process (steps ST22–ST31):

When the CPU determines at step ST12 that the keyed-in data is not from the addition data setting key K2, control passes to step ST22, where the CPU determines whether the keyed-in data is from a key of the channel number key subunit K1. If so, control passes to step ST23, where the CPU converts a numerical value corresponding to the operated channel number key to a remote control code and delivers same to the transmitter 60. In this case, if a channel number key "3" was operated, the CPU converts the "3" to a remote control code. The transmitter 60 drives the LED 59 in accordance with the received remote control code to thereby transmit same. Thereafter, control passes to step ST24, where the CPU increments the timer count by one.

Thereafter, at step ST25 the CPU determines on the basis of the count in the timer whether the continuous operation time of the channel number key has exceeded two seconds. If not, control passes to step ST26, where the CPU determines whether the channel number key has been released.

If not, control returns step ST24, where the CPU increments the timer count by one and again determines at step ST25 whether the key operating time has exceeded two seconds. If not, control passes to step ST26, where the CPU determines whether the channel number key has been released. That is, when the channel number key has been operated for less than two seconds, control repeats steps ST24, ST25 and ST26. Each time the CPU repeats this process once, it increments the timer count by one.

If in such state the CPU determines at step ST26 that the channel number key is released, control passes to step ST27, where the CPU clears the timer.

When the CPU determines at step ST25 that the continuous operation of the channel number key has exceeded two seconds, control passes to step ST28, where the CPU performs a sounding process in which the CPU delivers an intermittent buzzer on signal to the sounding unit 61 for a short time to thereby sound, for example, "pi, pi, ...".

After the sounding process at step ST28, control passes to step ST29, where the CPU converts the addition data designated by the value of the P register to a remote control code and delivers same to the transmitter 60.

In this case, since a numerical value "10+" is set if the value of the P register is, for example, "0", the CPU converts this addition data "10+" to a remote control code and sends same to the transmitter 60.

If, for example, a channel number key "3" is released in less than two seconds since the start of its operation in the remote control transmission process, a remote control code of the numerical value "3" alone is sent. Thus, a channel "3" is selected in the television set at the receiving end. If the channel number key "3" is operated for over two seconds, the CPU sends a remote control code of the numerical value "3" and addition data "10+" to thereby cause the television set to select a channel "13".

After the CPU has sent the remote control code of the addition data at step ST29, control passes to step ST30, where the CPU determines whether the channel number key has been released. If not, the CPU performs the process at step ST30 again. If the CPU determines that the channel number key has been released, control passes to step ST27, where the CPU clears the timer.

(c) A Different Key-In Process

When the CPU determines at step ST22 that the keyed-in data is not from a key of the channel number key subunit K1, control passes to step ST31, where the CPU performs a different key-in process and a displaying operation in that key-in process at step ST20 of FIG. 9.

The second embodiment mainly produces the following advantages:

(a) When a key of the channel number key subunit K1 of the key-in unit 54 continues to be operated for two seconds addition data to add a given numerical value ("10+""20+" or "30+") is sent in addition to data on a numerical value indicated by the operated key. For example if the addition data is "10+", and a channel number key "3" continues to be operated for less than a given time, data on "3" alone is sent. If the key is operated for more than the given time, data on "3" and addition data "10+" are sent. If addition data is "20+" which is a multiple of "10+", and the channel number key "3 " continues to be operated for more than the given time data on "3" and the addition data "20+" are sent. Therefore, a numeral of two figures is keyed in by the operation of the channel number key "3" alone in addition to the value indicative of the channel number key . Thus, a key-in operation involving data on a numeral of two figures is simplified.

(b) When the channel number key continues to be operated for two seconds, a sounding operation is performed at that time. Thus, it is confirmed that data on a numeral of two figures has been keyed in.

(c) The numerical value keyed in by the channel number key is displayed as channel data on the display 7. Thus the keyed-in channel data is confirmed visually.

The present invention is not limited to the particular embodiments. Many changes and modifications are possible without departing from the spirit and scope of the present invention defined by the attached claims, for example, as follows:

(a) The display 57 may display the current time to thereby allow the user to confirm a program now under broadcasting:

(b) While the arrangement is illustrated as addition data being sent after a channel number key subunit K1 of the key-in unit 54 continued to be operated for two seconds, the time of the continuous key operation is not limited to two seconds, but any time value may be selected as desired.

(c) Unless a channel number is required to be displayed, the display 57 and the display control unit 58 are not required to be provided. In this case, cost is reduced accordingly.

(d) Unless inputting data on a numeral of two figures is required to be informed by sound, the sounding unit 61 is not necessarily required to be provided, which reduces the cost as well.

(e) While the infrared LED 59 is used, an LED which emits light of another wavelength may be used in connection with a receiving end such as a television set. Alternatively, a lamp or a laser may be used instead.

(f) While the present invention has been illustrated and described as being applied to a television set, the present invention is not limited to that particular case. The present invention is applicable to a multi-remote control device, a video tape recorder, a tuner or a remote control device for a timepiece, etc., of course.

What is claimed is:

1. A remote control device for an electronic appliance, comprising:

a plurality of channel number inputting keys for inputting a channel number to the remote control device;

channel number code sending means for, when any one of said plurality of channel number inputting keys is operated, sending a channel number code corresponding to the operated channel number inputting key;

an end code sending key;

end code sending means for sending an end code which represents that said channel number code sending means has finished sending the channel number code, in response to operation of said end code sending key;

a further key different from said plurality of channel number inputting keys and said end code sending key, said further key corresponding to a function;

determining means for, when said further key is operated, determining whether any one of said plurality of channel number inputting keys was operated to send the corresponding channel number code, directly before said further key has been operated;

control means for controlling said end code sending means to send the end code for channel selection when said determining means determines that one of said plurality of channel number inputting keys was operated directly before said further key has been operated; and function executing means for executing the function corresponding to said further key after said control means has controlled said end code sending means to send the end code.

2. A remote control device according to claim 1, further comprising:

timekeeping means for measuring the current time; and current time display means for displaying the current time.

3. A remote control device according to claim 1, comprising a case to which a band is attached for wearing said remote control device on a wrist, said case enclosing respective elements of said remote control device therein.

4. A remote control device according to claim 1, further comprising:

means for controlling said end code sending means to send the end code, when said further key and said end code sending key are not operated within a given time after any one of said plurality of channel number inputting keys was operated.

5. A remote control device according to claim 1, wherein said determining means comprises operation storage means for storing the fact that any one of said plurality of channel number inputting keys was operated when that fact occurred, said operation storage means being cleared when said further key is operated.

6. A remote control device according to claim 1, wherein said control means sends a remote control code, using infrared rays.

7. A remote control device according to claim 6, further comprising:

display means for displaying a remote control code sent by said control means.

* * * * *